US011437002B2

(12) United States Patent
Suezawa et al.

(10) Patent No.: US 11,437,002 B2
(45) Date of Patent: Sep. 6, 2022

(54) SIMULATION SYSTEM

(71) Applicant: SEKISUI HOUSE, LTD., Osaka (JP)

(72) Inventors: Takahiro Suezawa, Osaka (JP); Takeshi Miki, Osaka (JP); Yuusuke Minami, Osaka (JP); Chiho Hiraoka, Osaka (JP); Shouto Iwata, Osaka (JP); Yuuta Kawazoe, Osaka (JP); Shintarou Kawakami, Osaka (JP); Tetsuya Yamato, Osaka (JP); Masayuki Ogawa, Osaka (JP)

(73) Assignee: SEKISUI HOUSE, LTD., Osaka (JP)

( * ) Notice: Subject to any disclaimer, the term of this patent is extended or adjusted under 35 U.S.C. 154(b) by 0 days.

(21) Appl. No.: 16/969,741

(22) PCT Filed: Aug. 28, 2019

(86) PCT No.: PCT/JP2019/033749
§ 371 (c)(1),
(2) Date: Aug. 13, 2020

(87) PCT Pub. No.: WO2020/045512
PCT Pub. Date: Mar. 5, 2020

(65) Prior Publication Data
US 2021/0005165 A1 Jan. 7, 2021

(30) Foreign Application Priority Data
Aug. 31, 2018 (JP) .............................. JP2018-162570

(51) Int. Cl.
*G09G 5/38* (2006.01)
*G06F 3/14* (2006.01)

(52) U.S. Cl.
CPC ................. *G09G 5/38* (2013.01); *G06F 3/14* (2013.01); *G09G 2354/00* (2013.01)

(58) Field of Classification Search
CPC ......... G09G 5/38; G09G 2354/00; G06F 3/14
See application file for complete search history.

(56) References Cited

U.S. PATENT DOCUMENTS

| 4,887,898 A | 12/1989 | Halliburton et al. | |
| 10,157,502 B2* | 12/2018 | Montgomerie | .......... G09B 5/14 |
| 2006/0167630 A1* | 7/2006 | Noma | ..................... G06F 30/15 |
| | | | 701/117 |
| 2014/0374474 A1* | 12/2014 | Huang | ............... G06Q 30/0623 |
| | | | 235/375 |

(Continued)

FOREIGN PATENT DOCUMENTS

| JP | H1039730 A | 2/1998 |
| JP | 10228231 A | 8/1998 |

(Continued)

OTHER PUBLICATIONS

English Translation of JP-2016213776-A (Year: 2016).*
Notice of Reasons for Refusal for Japanese Application No. 2018-162570 dated Apr. 12, 2022, 6 pages.

*Primary Examiner* — Samantha (Yuehan) Wang
(74) *Attorney, Agent, or Firm* — Cantor Colburn LLP

(57) ABSTRACT

A simulation system includes a display device and a selection unit. The display device shows an image on an exhibit related to a building. The selection unit selects content of the image shown on the exhibit. The selection unit includes a display section that displays information corresponding to the image.

11 Claims, 5 Drawing Sheets

(56) References Cited

U.S. PATENT DOCUMENTS

2015/0097859 A1\* 4/2015 Huang .................... G06T 11/00
                                                       345/632

FOREIGN PATENT DOCUMENTS

| JP | 2001305969 | A |   | 11/2001 |
|----|------------|---|---|---------|
| JP | 2002328953 | A |   | 11/2002 |
| JP | 2004246233 | A |   | 9/2004  |
| JP | 2016038820 | A |   | 3/2016  |
| JP | 2016213776 | A | \* | 12/2016 |
| JP | 2016213776 | A |   | 12/2016 |
| WO | 2020045512 | A1 |  | 3/2020  |

\* cited by examiner

SIMULATION SYSTEM

Priority under 35 U.S.C. § 119(a) and 35 U.S.C. § 365(b) is claimed from Japanese Patent Application No. 2018-162570, filed on Aug. 31, 2018, the disclosure of which is also incorporated herein by reference.

TECHNICAL FIELD

The present invention relates to a simulation system.

BACKGROUND ART

A known simulation system creates a simulation of a design related to a building. As one example, Patent Document 1 describes a method for displaying the design of a structure. The method shows, on a display, the external appearance of a building, the shapes of roofs, and exterior wall patterns and changes the design of the external appearance of the building to match the roof shape and exterior wall pattern selected by a user. This allows a user to image the design of a building in accordance with preferences of the user.

PRIOR ART DOCUMENT

Patent Document

Patent Document 1: Japanese Laid-Open Patent Publication No. 2002-328953

SUMMARY OF THE INVENTION

Problems that the Invention is to Solve

In the structure design display method, a simulation is created based on the design shown on the display. Thus, there may be a great difference between the image of the building imagined by the user and the actual physical building.

Means for Solving the Problems (1) A simulation system related to the present invention includes a display device and a selection unit. The display device shows an image on an exhibit related to a building. The selection unit selects content of the image shown on the exhibit. The selection unit includes a display section that displays information corresponding to the image.

In the simulation system, an image is shown on the exhibit. Thus, a user can be provided with information that is close to the actual information with regard to design, functionality, and usability of a building. This decreases the difference between an image of a building imagined by the user and the actual physical building.

(2) In a preferred example of the simulation system described in (1), the display section displays the information using at least one of a sample image corresponding to the image shown on the exhibit and a sample material corresponding to the image.

Thus, the user can easily recognize the image shown on the exhibit.

(3) In a preferred example of the simulation system described in (2), the sample image includes at least one of a pattern corresponding to the exhibit and an article arranged on the exhibit.

Thus, the user can be provided with a variety of information.

(4) In a preferred example of the simulation system described in any one of (1) to (3), the selection unit is arranged on the exhibit.

Thus, the content of the image is easily selected.

(5) In a preferred example of the simulation system described in any one of (1) to (4), the selection unit is a portable unit.

This simplifies the configuration of the simulation system.

(6) In a preferred example of the simulation system described in any one of (1) to (5), the selection unit includes independently formed independent selectors. The display sections of the independent selectors each display different information.

Thus, the user can be provided with a variety of information.

(7) In a preferred example of the simulation system described in any one of (1) to (6), the exhibit includes a detector that detects the selection unit.

Thus, an image is easily shown on the exhibit.

(8) In a preferred example, the simulation system described in (7) further includes a controller that refers to a detection result of the detector and shows the image corresponding to the information with the display device.

Thus, an image is easily shown on the exhibit.

(9) In a preferred example of the simulation system described in (8), the controller refers to the detection result of the detector and selects a display position of the image on the exhibit.

Thus, the user can be provided with a variety of information.

(10) In a preferred example of the simulation system described in any one of (1) to (9), the exhibit is full-scaled.

This further decreases the difference between the image of a building imagined by the user and the actual physical building.

Effects of the Invention

The simulation system of the present invention decreases the difference between the image of a building imagined by the user and the actual physical building.

MODES FOR CARRYING OUT THE INVENTION

Embodiment

Figure 1:
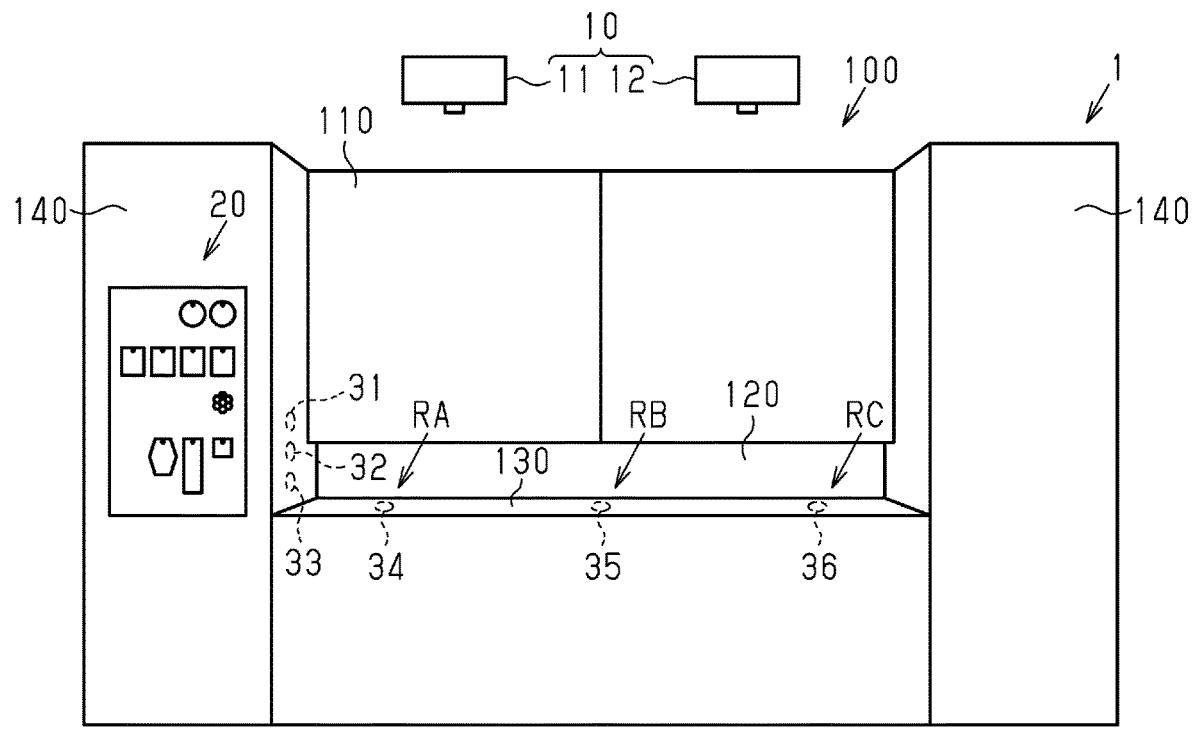
FIG. 1 is a perspective view of an exhibit to which a simulation system in accordance with one embodiment is applied.

One example of a simulation system 1 will now be described with reference to FIGS. 1 and 2. The simulation system 1 is a system configured to provide a user with information that is close to the actual information with regard to building-related designs, functionality, and usability by showing an image on a building-related exhibit 100 (hereafter, referred to as "exhibit 100"). The exhibit 100 includes, for example, an exhibit related to the interior of a building and/or an exhibit related to the exterior of a building. Examples of the exhibit related to the interior of a building include a kitchen, a living room, a dining room, a living-dining room, a bedroom, a reception room, a study, an entrance, a hallway, a staircase, a toilet, a washroom, a powder room, a bathroom, a storage, and a closet. Examples of the exhibit related to the exterior of a building include a roof, an exterior wall, a balcony, a handrail, a surface material, a foundation, and a coping. In the example shown in FIG. 1 etc., the exhibit 100 is part of the interior of a building that includes a kitchen. The exhibit 100 includes a cabinet 110, a kitchen panel 120, a worktop 130, and two wall portions 140. The exhibit 100 may have any size. In a preferred example, the exhibit 100 is full-scaled. This further decreases the difference between an image of the building imagined by a user and the actual physical building. The exhibit 100 may be arranged at any location. In a first example, the exhibit 100 is arranged inside or outside a mobile showroom. In a second example, the exhibit 100 is arranged inside or outside a permanent showroom.

Figure 2:
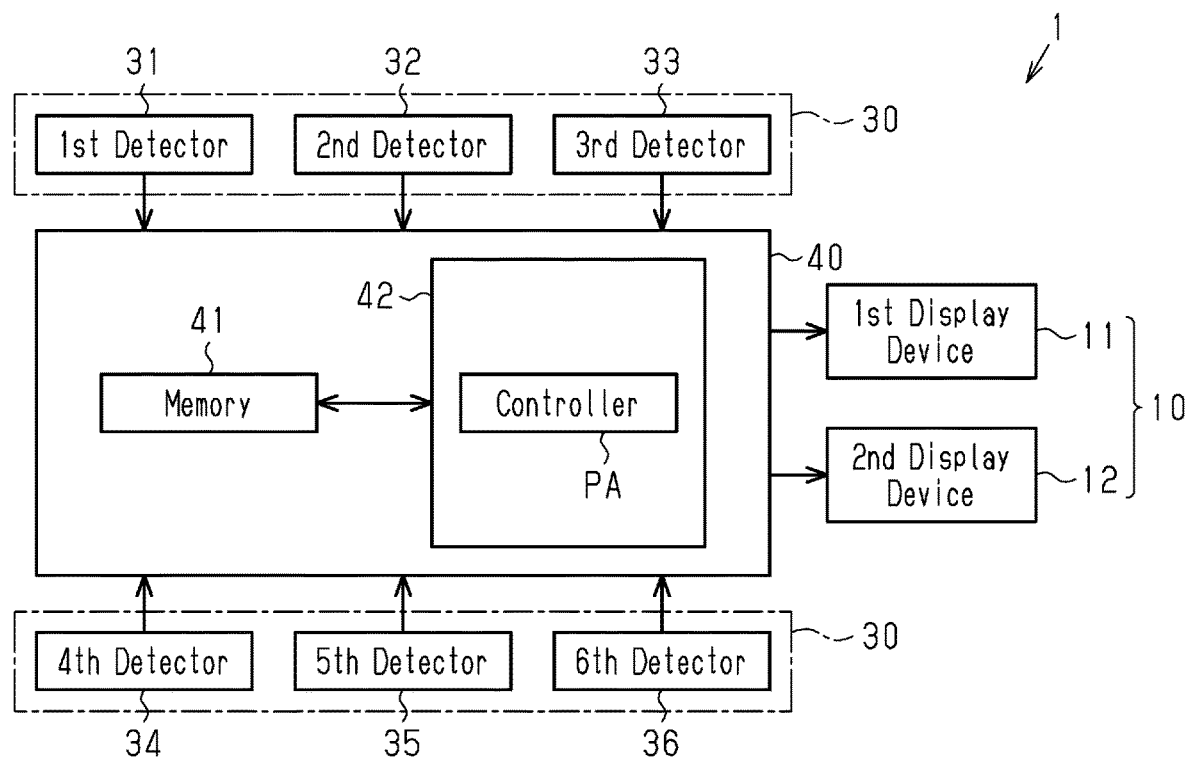
FIG. 2 is a block diagram of the simulation system in accordance with the embodiment.

As shown in FIG. 2, the simulation system 1 includes a display device 10, a selection unit 20 (refer to FIG. 1), a detector 30, and a terminal device 40. The display device 10 shows an image on the exhibit 100 by projecting the image onto the exhibit 100. The display device 10 is, for example, a projector. The display device 10 is arranged at a position that allows the display device 10 to show an image on the exhibit 100. There are one or more of display devices 10. In the example shown in FIG. 1 etc., the display device 10 includes a first display device 11 and a second display device 12. The first display device 11 and the second display device 12 show an image on the exhibit 100 without forming shadows in the image shown on the exhibit 100 (hereafter, referred to as "display image"). The display image includes a first image, a second image, and a third image. The first image is an image related to a pattern of the exhibit 100. The second image is an image related to an article arranged on the exhibit 100. The third image is an image that includes cost-related information of designs set in correspondence with the first image and the second image (hereafter, referred to as "cost information"). The article arranged on the exhibit 100 is selected in accordance with the type of the exhibit 100. When the exhibit 100 is part of the interior including a kitchen, one example of the article arranged on the exhibit 100 is a sink or a cooking stove. In this manner, the simulation system 1 provides a user with various information with regard to designs, functionality, and usability of a building.

Figure 3:
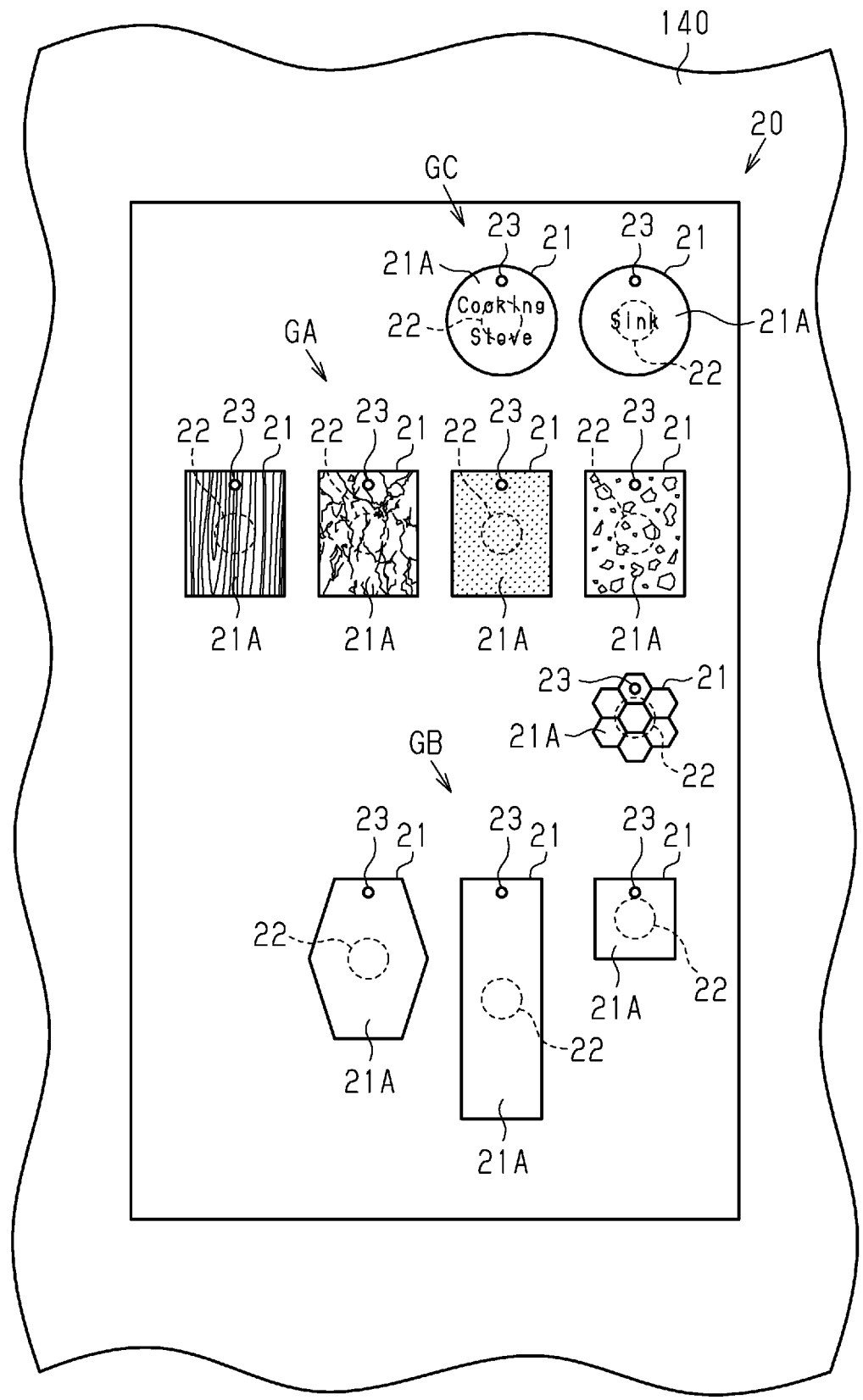
FIG. 3 is a front view of a selection unit shown in FIG. 1.

The selection unit 20 selects content of the display image. The selection unit 20 may be arranged at any position. In the example shown in FIG. 1 etc., the selection unit 20 is arranged on one of the wall portions 140 of the exhibit 100. Thus, the content of the display image can easily be selected. In a second example, the selection unit 20 is arranged on the other one of the wall portions 140 of the exhibit 100. In a third example, the selection unit 20 is arranged at a position other than on the exhibit 100. As shown in FIG. 3, the selection unit 20 includes independent selectors 21, radio frequency (RF) tags 22, and supports 23. The independent selectors 21 are formed independently. The RF tags 22 are respectively attached to the independent selectors 21. The supports 23 respectively support the independent selectors 21.

The independent selectors 21 may each have any form. In the example shown in FIG. 3 etc., each independent selector 21 is a portable unit that can easily be removed from the support 23 and carried. This simplifies the configuration of the simulation system 1. In one example, each independent selector 21 is a compact panel. In another example, each independent selector 21 is a smartphone or a tablet terminal. Each independent selector 21 may be formed from any material. In a preferred example, each independent selector 21 is formed from a lightweight material so that a user can easily carry the independent selector 21. Examples of a lightweight material include a styrene board, a plywood, a medium density fiberboard (MDF), and a cloth. Each independent selector 21 includes a display section 21A that displays information corresponding to the display image (hereafter referred to as "display image information"). The display section 21A of each independent selector 21 displays different display image information.

The independent selectors 21 are classified into a first group GA, a second group GB, and a third group GC in accordance with the types of the display image information displayed on the display sections 21A. The display sections 21A of the independent selectors 21 that are classified into the first group GA each display a pattern of the exhibit 100 as the display image information. The pattern of the exhibit 100 is determined in accordance with the type of the exhibit 100. When the exhibit 100 is part of an interior including a kitchen, examples of the pattern of the exhibit 100 include a wood-grain-like pattern, a marble-like pattern, a tile-like pattern, a stone-like pattern, a cloth-like pattern, any paint pattern, and a metallic pattern. The display image information can be displayed on each display section 21A by selecting any means that allow a user to recognize the content of the display image information. In one example, each display section 21A displays the display image information using at least one of a sample image corresponding to the display image and a sample material corresponding to the display image. Thus, a user can easily recognize the display image. In the example shown in FIG. 3 etc., the display sections 21A display the display image information using the sample images corresponding to the display images. The sample images corresponding to the display images are respectively printed on or adhered to the independent selectors 21. When the display sections 21A display the display image information using the sample materials corresponding to the display images, the sample materials corresponding to the display images are respectively adhered to the independent selectors 21 or the independent selectors 21 are respectively formed from the sample materials. When each independent selector 21 is a smartphone or a tablet terminal, the display image information is shown on a display screen that serves as the display section 21A The display sections 21A of the independent selectors 21 that are classified into the second group GB each display the shape of a tile in the pattern of the exhibit 100 as the display image information. The display sections 21A of the independent selectors 21 that are classified into the third group GC each display an article arranged on the exhibit 100 using text or a sample image of the article as the display image information. In the example shown in FIG. 3 etc., the display sections 21A of the independent selectors 21, which are classified into the third group GC each use text to display the article arranged on the exhibit 100 as the display image information.

Information identifying the display image information displayed on the display sections 21A (hereafter, referred to as "identification information") and cost information corresponding to the display image information displayed on the display sections 21A and are registered to the RF tags 22. Each RF tag 22 is a passive tag, an active tag, or a semi-active tag. Each RF tag 22 transmits radio waves through electromagnetic induction method or radio waves method. The RF tags 22 are respectively coupled to the independent selectors 21.

The supports 23 are attached to one of the wall portions 140. One example of the support 23 is a nail hook. The independent selectors 21 are supported in a state hooked to the supports 23.

The detector 30 of FIG. 2 detects the identification information registered to the RF tags 22 of the selection unit 20 (refer to FIG. 3). One example of the detector 30 is a typical receiver or a radio frequency identifier (RFID) reader. The detector 30 is connected to the terminal device 40 in a manner allowing for communication with the terminal device 40. The detector 30 communicates with the terminal device 40 through wireless communication or wired communication. The detector 30 transmits the detected identification information to the terminal device 40. The detector 30 may be arranged at any position. In the example shown in FIG. 1 etc., the detector 30 is arranged on the exhibit 100. In the second example, the detector 30 is arranged at any positions other than on the exhibit 100.

The detector 30 includes a first detector 31, a second detector 32, a third detector 33, a fourth detector 34, a fifth detector 35, and a sixth detector 36. The first detector 31, the second detector 32, and the third detector are arranged inside one of the wall portions 140. The first detector 31, the second detector 32, and the third detector 33 detect the identification information registered to the RF tags 22 that are attached to the independent selectors 21 included in the first group GA and the second group GB. When the first detector 31 detects the identification information, the display image corresponding to the identification information is shown on the cabinet 110. When the second detector 32 detects the identification information, the display image corresponding to the identification information is shown on the kitchen panel 120. When the third detector 33 detects the identification information, the display image corresponding to the identification information is shown on the worktop 130. When the first detector 31, the second detector 32, and the third detector 33 detect the identification information, the cost information corresponding to the identification information is shown on the exhibit 100. The cost information may be shown at any position of the exhibit 100. In one example, the cost information is shown in the vicinity of the one of the first detector 31, the second detector 32, and the third detector 33 that detected the identification information.

The fourth detector 34, the fifth detector 35, and the sixth detector 36 detect the identification information registered to the RF tags 22 that are attached to the independent selectors 21 included in the third group GC. The fourth detector 34, the fifth detector 35, and the sixth detector 36 are arranged on a lower surface of the worktop 130. The fourth detector 34, the fifth detector 35, and the sixth detector 36 are arranged in predetermined intervals in a longitudinal direction of the worktop 130. In the longitudinal direction of the worktop 130, the fourth detector 34 is arranged on the lower surface of the worktop 130 in a region close to one of the wall portions 140. In the longitudinal direction of the worktop 130, the fifth detector 35 is arranged in a central region of the lower surface of the worktop 130. In the longitudinal direction of the worktop 130, the sixth detector 36 is arranged on the lower surface of the worktop 130 in a region close to the other one of the wall portions 140. When the fourth detector 34 detects the identification information, the display image corresponding to the identification information is shown in a predetermined region including the fourth detector 34 (hereafter, referred to as "first predetermined region RA") on an upper surface of the worktop 130. When the fifth detector 35 detects the identification information, the display image corresponding to the identification information is shown in a predetermined region including the fifth detector 35 (hereafter, referred to as "second predetermined region RB") on the upper surface of the worktop 130. When the sixth detector 36 detects the identification information, the display image corresponding to the identification information is shown in a predetermined region including the sixth detector 36 (hereafter, referred to as "third predetermined region RC") on the upper surface of the worktop 130. When the fourth detector 34, the fifth detector 35, and the sixth detector 36 detect the identification information, the cost information corresponding to the detected identification information is shown on the exhibit 100. The cost information may be shown at any position of the exhibit 100. In one example, the cost information is shown in the one of the predetermined regions RA to RC that corresponds to the one of the fourth detector 34, the fifth detector 35, and the sixth detector 36 that detected the identification information.

Examples of the terminal device 40 include a personal computer, a server, and a smart device. A smart device is, for example, a tablet or a smartphone. When the terminal device 40 is a server, the terminal device 40 is located inside or outside the showroom. In the example shown in FIG. 2, the terminal device 40 is a personal computer. The terminal device 40 includes a memory 41 and a processor 42. The memory 41 is, for example, an auxiliary memory such as a hard disk drive. The memory 41 stores one or more types of application software for showing the display image on the exhibit 100 (hereafter, referred to as "image display software").

The processor 42 is connected to the memory 41 in a manner allowing for communication with the memory 41. The processor 42 executes the image display software stored in the memory 41 to form one or more function blocks of the processor 42. The one or more function blocks include a controller PA. The memory 41 stores information obtained by execution of the image display software by the processor 42.

The controller PA refers to a detection result of the detector 30 and shows an image corresponding to the display image information, which is associated with the identification information, using the display device 10. Thus, an image is easily shown on the exhibit 100. The controller PA refers to the detection result of the detector 30 and selects a display position of an image on the exhibit 100. Thus, a user can be provided with a variety of information. When the first detector 31 detects the identification information, the controller PA selects the cabinet 110 as the display position. When the second detector 32 detects the identification information, the controller PA selects the kitchen panel 120 as the display position. When the third detector 33 detects the identification information, the controller PA selects the worktop 130 as the display position. When the fourth detector 34 detects the identification information, the controller PA selects the first predetermined region RA as the display position. When the fifth detector 35 detects the identification information, the controller PA selects the second predetermined region RB as the display position. When the sixth detector 36 detects the identification information, the controller PA selects the third predetermined region RC as the display position.

Figure 4:
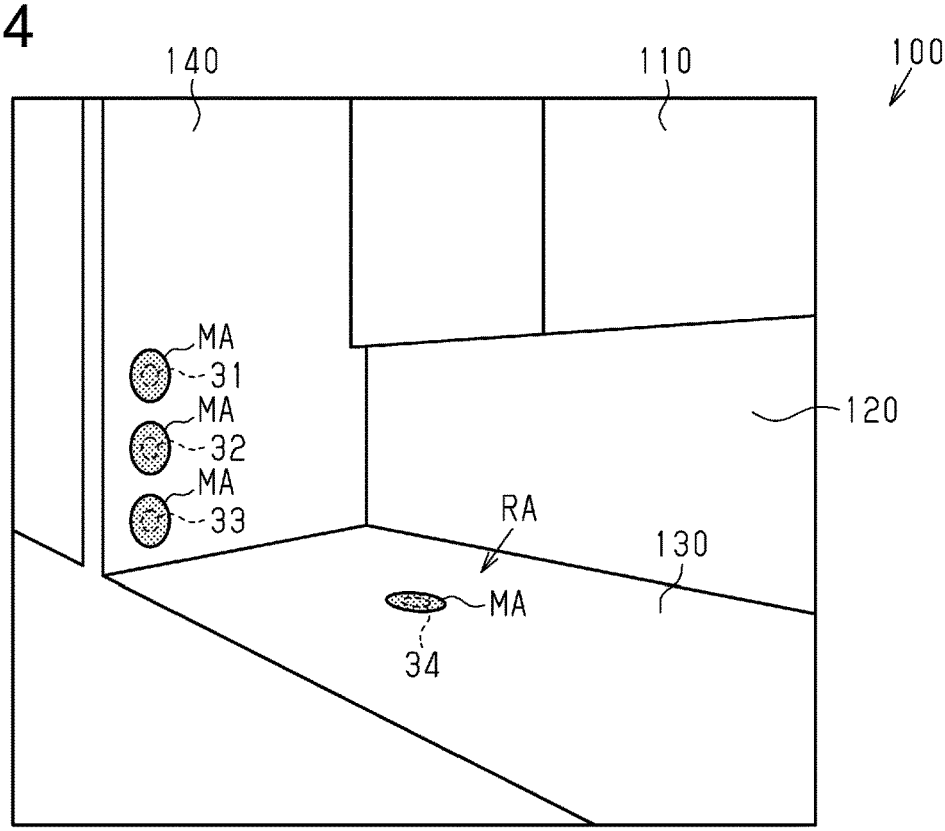
FIG. 4 is a perspective view of the exhibit in a state in which a display device of FIG. 2 is showing a marker on the exhibit.

One example of how to use the simulation system 1 will now be described with reference to FIGS. 4 to 8. When none of the detectors 30 detect the identification information of the RF tags 22, as shown in FIG. 4, the display device 10 only shows markers MA that indicate the positions of the detectors 30 on the exhibit 100 as the display image. The markers MA shown on the exhibit 100 may be printed or the like.

Figure 5:
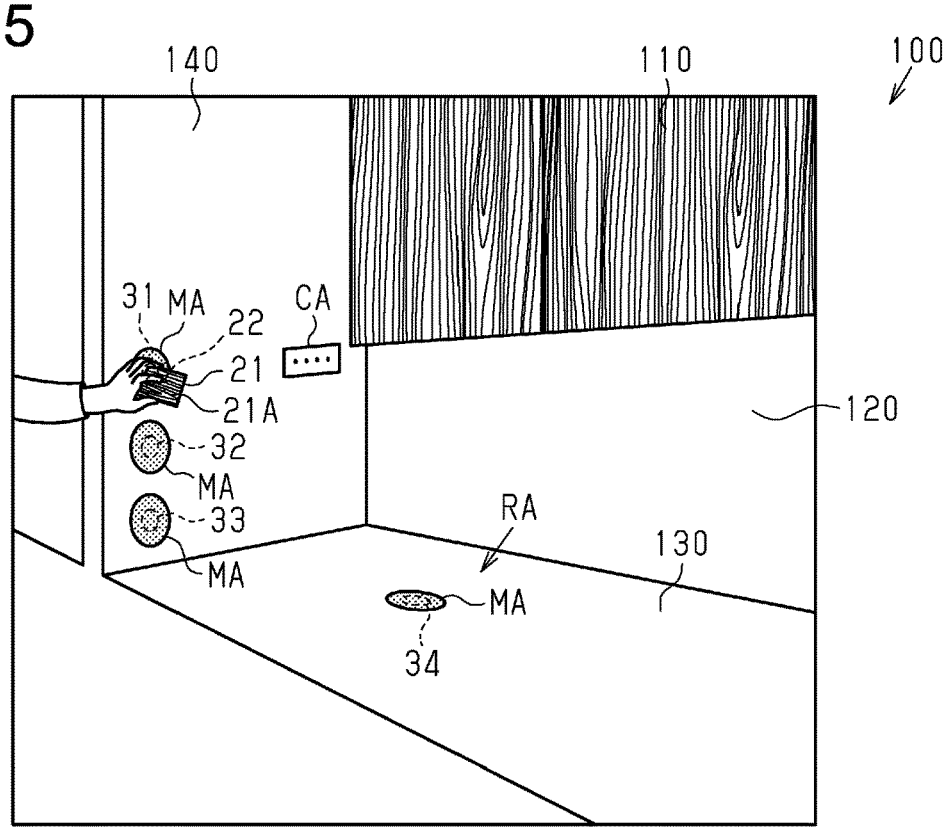
FIG. 5 is a perspective view of the exhibit in a state in which the display device of FIG. 2 is showing a display image on a cabinet.

As shown in FIG. 5, when a user holds any independent selector 21 that is included in the first group GA or the second group GB over the marker MA that indicates the position of the first detector 31, the first detector 31 detects the identification information. The display device 10 shows the display image corresponding to the display image information displayed on the display section 21A of the held independent selector 21 on the cabinet 110. The display device 10 shows cost information CA corresponding to the display image information displayed on the display section 21A of the held independent selector 21 in the vicinity of the first detector 31.

Figure 6:
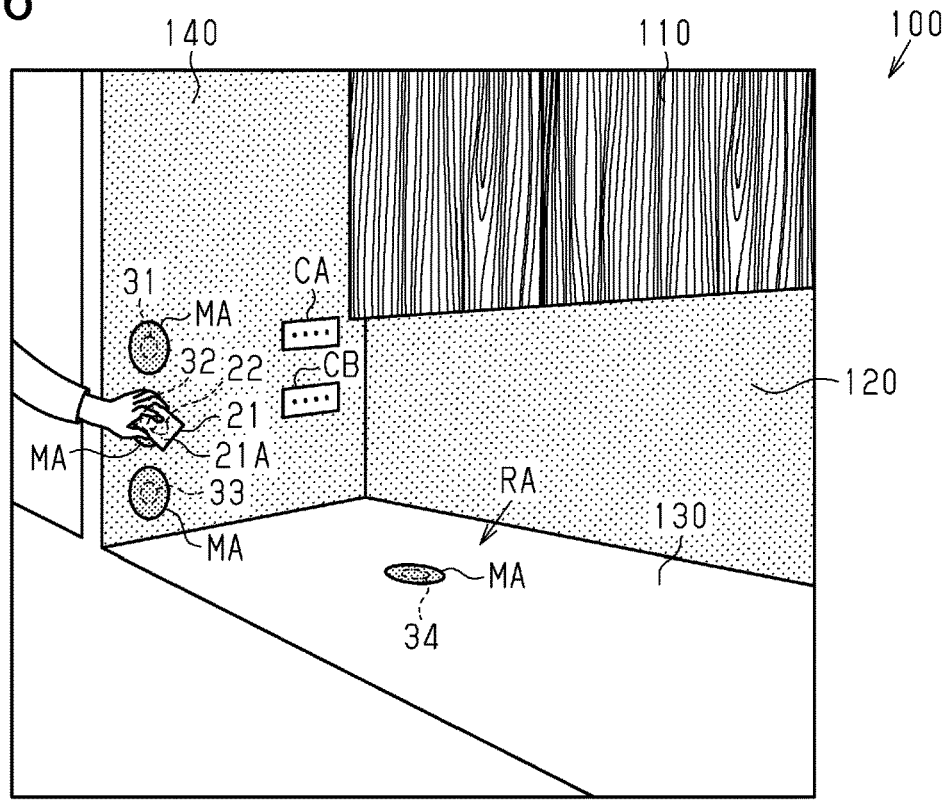
FIG. 6 is a perspective view of the exhibit in a state in which the display device of FIG. 2 is showing display images on the cabinet and a kitchen panel.

As shown in FIG. 6, when a user holds any independent selector 21 that is included in the first group GA or the second group GB over the marker MA that indicates the position of the second detector 32, the second detector 32 detects the identification information. The display device 10 shows the display image corresponding to the display image information displayed on the display section 21A of the held independent selector 21 on the kitchen panel 120. The display device 10 shows cost information CB corresponding to the display image information displayed in the display section 21A of the held independent selector 21 in the vicinity of the second detector 32.

Figure 7:
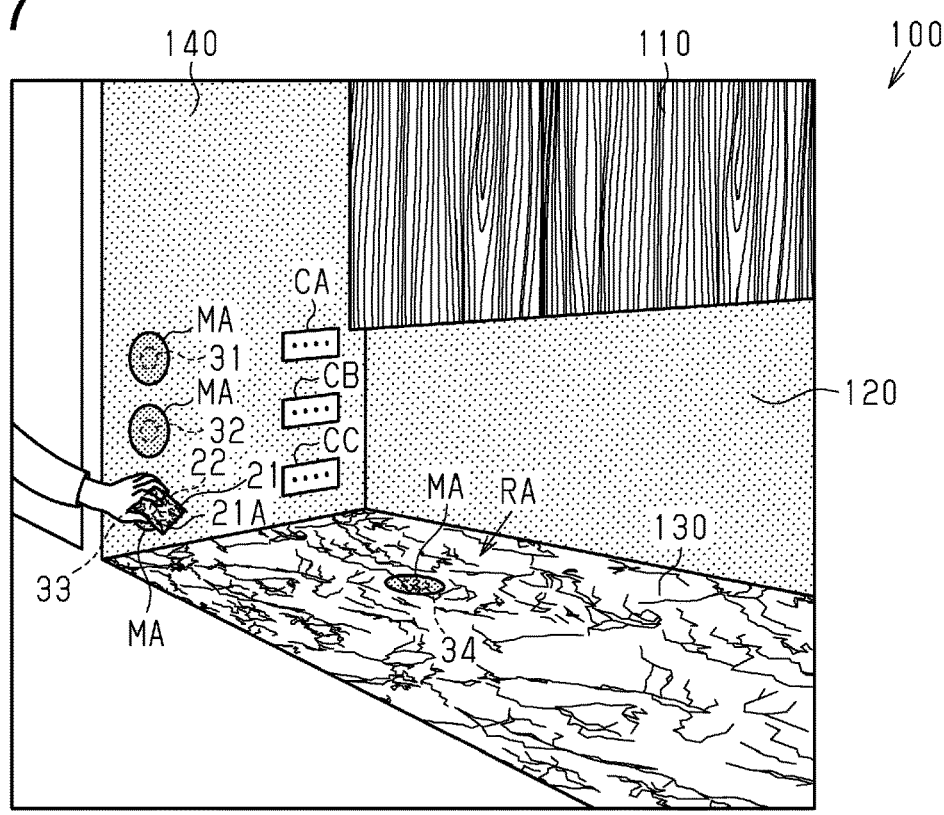
FIG. 7 is a perspective view of the exhibit in a state in which the display device of FIG. 2 is showing display images on the cabinet, the kitchen panel, and a worktop.

As shown in FIG. 7, when a user holds any independent selector 21 that is included in the first group GA or the second group GB over the marker MA that indicates the position of the third detector 33, the third detector 33 detects the identification information. The display device 10 shows the display image corresponding to the display image information displayed on the display section 21A of the held independent selector 21 on the worktop 130. The display device 10 shows cost information CC corresponding to the display image information displayed on the display section 21A of the held independent selector 21 in the vicinity of the third detector 33.

Figure 8:
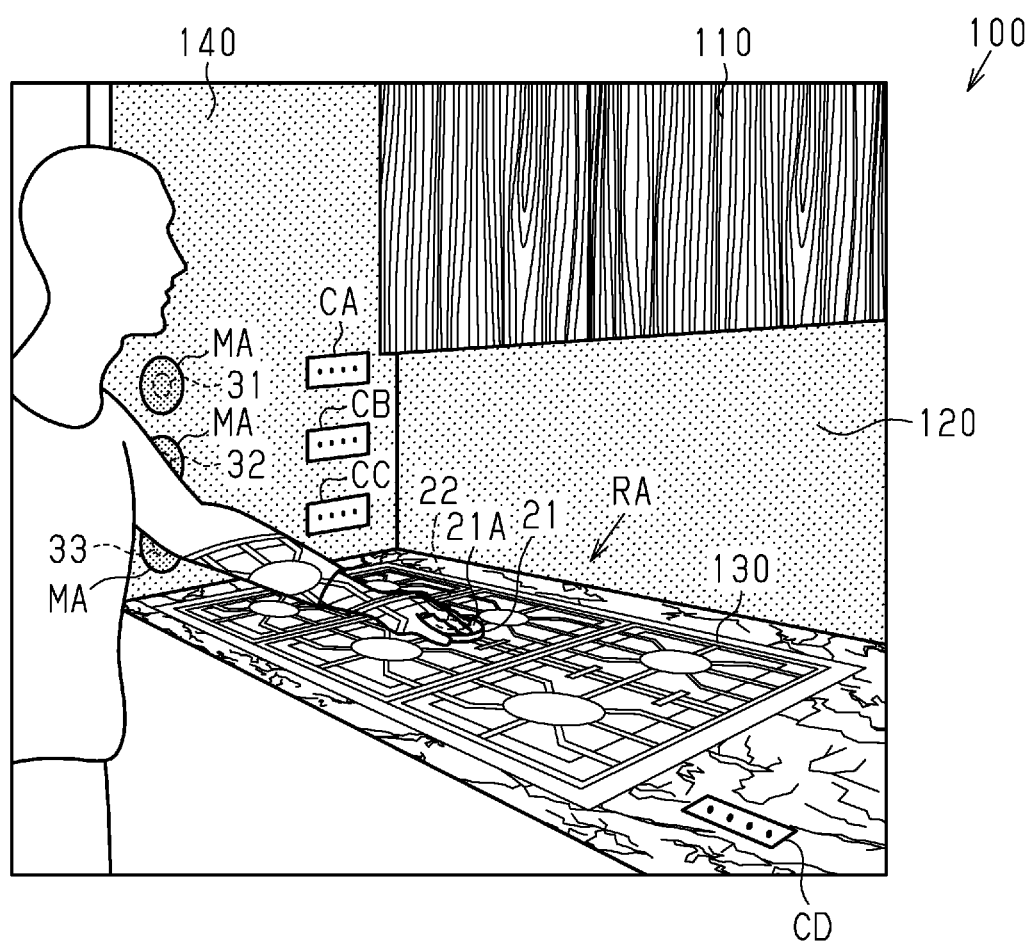
FIG. 8 is a perspective view of the exhibit in a state in which the display device of FIG. 2 is showing display images on the cabinet, the kitchen panel, the worktop, and a predetermined region.

As shown in FIG. 8, when a user holds any independent selector 21 that is included in the third group GC over the marker MA that indicates the position of the fourth detector 34, the fourth detector 34 detects the identification information. The display device 10 shows the display image corresponding to the display image information displayed on the display section 21A of the held independent selector 21 in the first predetermined region RA on the worktop 130. FIG. 8 shows a state in which the display device 10 shows an image of a cooking stove in the first predetermined region. The display device 10 shows cost information CD corresponding to the display image information displayed on the display section 21A of the held independent selector 21 at a position in the first predetermined region RA.

The operation and advantages of the simulation system 1 will now be described.

The exhibit 100 shows an image so that a user can be provided with information that is close to the actual information with regard to the design, functionality, and usability of a building. This decreases the difference between an image of a building imagined by a user and the actual physical building.

MODIFIED EXAMPLES

The above embodiment exemplifies, without any intention to limit, an applicable form of a simulation system related to the present invention. The simulation system related to the present invention can take a form differing from the form illustrated in the embodiment. In one example, some of the components of the embodiment may be replaced, changed, or omitted. Further, another component may be added to the embodiment. Examples of a modification to the embodiment will now be described.

The configuration of the display device 10 can be changed in any manner. The display device 10 of the simulation system 1 according to a modified example may include a display screen that shows the display image. In the modified example, the display screen of the display device 10 is attached to a surface of the exhibit 100. Alternatively, the exhibit 100 is configured by the display screen. In a case where the display screen of the display device 10 is attached to a surface of the exhibit 100, it is preferred that the display screen be shaped substantially identical to the surface of the exhibit 100. In the simulation system 1 of the modified example, the display device 10 refers to the detection result of the detector 30 when showing the display image corresponding to the display image information on the display screen. The simulation system 1 of the modified example obtains substantially the same advantage as the simulation system 1 of the embodiment.

The configuration of the selection unit 20 may be changed in any manner. The selection unit 20 of the simulation system 1 according to a first modified example includes a display screen that shows the display image information as the display section 21A. Preferably, the display section 21A of the simulation system 1 according to the first modified example is configured to display image information, which is stored in a storage medium carried by a user, in addition to the display image information registered in advance. Examples of the storage medium include a memory card, a compact disc, a flash memory, and a hard disk drive. The display device 10 of the simulation system 1 according to the first modified example shows the display image information, which is registered in advance, and the display image corresponding to the display image information, which is stored in a storage medium carried by a user, on the exhibit 100. Each selection unit 20 of the simulation system according to a second modified example includes a one-dimensional code or a two-dimensional code, to which the identification information is registered, instead of the RF tag 22. In the second modified example, the detector 30 is a code reader that reads one-dimensional codes or two-dimensional codes.

The type of the independent selectors 21 may be changed in any manner. The simulation system 1 of a first modified example includes independent selectors 21 classified into the third group GC and corresponding to multiple sizes of the article arranged on the exhibit 100. The simulation system of the first modified example is configured to change the size of the article arranged on the exhibit 100 in accordance with the preference of a user. Thus, the user can be provided with a further variety of information with regard to design, functionality, and usability of a building. The simulation system 1 of a second modified example includes the independent selectors 21 classified into a fourth group. The display sections 21A of the independent selectors 21 classified into the fourth group each display information related to a total design of the exhibit 100 using at least one of text, graphics, and photographs as the display image information. In the second modified example, when the detector 30 detects the identification information registered to the RF tags 22 included in the independent selectors 21 classified into the fourth group, the display device 10 shows the display image on the exhibit 100 so that the exhibit 100 has a design with a sense of uniformity. Examples of a design with sense of uniformity include a European design, a Colonial design, a Sedona-style design, and a farmhouse-style design.

The processor 42 does not have to include a central processing unit and a memory to execute the above-described various types of processes with software. For example, the processor 42 may include exclusive hardware (application specific integrated circuit: ASIC) to execute at least some of the processes. That is, the processor 42 can be circuitry that includes 1) one or more exclusive hardware circuit such as ASIC, 2) one or more processors (microcomputers) running on a computer program (software), or 3) a combination of the above.

The invention claimed is:

1. A simulation system, comprising:
  a display device that shows an image on an exhibit related to a building; and
  a selection tool for a user to select content of the image shown on the exhibit, the selection tool including independent selector panels, an identification information of the image being registered in each of the independent selector panels,
  wherein each of the independent selector panels includes a display section that displays information corresponding to the image shown on the exhibit,
  wherein each of the independent selector panels includes a radio frequency (RF) tag,
  wherein the RF tag includes at least one of information identifying the image shown on the exhibit and cost information corresponding to the image shown on the exhibit,
  wherein the display section of the independent selector panel includes a sample image or a sample material corresponding to the image shown on the exhibit,
  wherein the sample image is printed on or adhered to the display section of the independent selector panel,
  wherein the sample material is adhered to the display section, or the independent selector panel is formed from the sample material, and
  wherein each of the independent selector panels is formed from one of a styrene board, a plywood, a medium density fiberboard (MDF), and a cloth.

2. The simulation system according to claim 1, wherein the display section displays the information using at least one of a sample image corresponding to the image shown on the exhibit and a sample material corresponding to the image.

3. The simulation system according to claim 2, wherein the sample image includes at least one of a pattern corresponding to the exhibit and an article arranged on the exhibit.

4. The simulation system according to claim 1, wherein the selection tool is arranged on the exhibit.

5. The simulation system according to claim 1, wherein each of the independent selector panels is a portable unit.

6. The simulation system according to claim 1, wherein the display sections of the independent selectors each display different information.

7. The simulation system according to claim 1, wherein the exhibit includes a detector that detects the identification information of the image being registered in each of the independent selector panels.

8. The simulation system according to claim 7, further comprising:
  a circuit that refers to a detection result of the detector and shows the image corresponding to the information with the display device.

9. The simulation system according to claim 8, wherein the circuit refers to the detection result of the detector and selects a display position of the image on the exhibit.

10. The simulation system according to claim 1, wherein the exhibit is full-scaled.

11. The simulation system according to claim 1, wherein each of the independent selector panels is formed from a portable material that can be carried by a user.

* * * * *